(12) United States Patent
An et al.

(10) Patent No.: US 10,705,155 B2
(45) Date of Patent: Jul. 7, 2020

(54) MEMORY SYSTEMS AND POWER MANAGEMENT APPARATUSES INCLUDING SECONDARY POWER DEVICES, AND RELATED METHODS OF OPERATION

(71) Applicant: Samsung Electronics Co., Ltd., Suwon-si, Gyeonggi-do (KR)

(72) Inventors: Su-yong An, Asan-si (KR); Byung-ok Kang, Seoul (KR); Woo-sung Lee, Seoul (KR); Jae-woong Choi, Yongin-si (KR); Young-sang Cho, Seoul (KR)

(73) Assignee: Samsung Electronics Co., Ltd. (KR)

( * ) Notice: Subject to any disclaimer, the term of this patent is extended or adjusted under 35 U.S.C. 154(b) by 49 days.

(21) Appl. No.: 16/038,802

(22) Filed: Jul. 18, 2018

(65) Prior Publication Data

US 2019/0162797 A1 May 30, 2019

(30) Foreign Application Priority Data

Nov. 28, 2017 (KR) ........................ 10-2017-0161005

(51) Int. Cl.
| | | |
|---|---|---|
| *G01R 31/40* | (2020.01) | |
| *G11C 29/02* | (2006.01) | |
| *G01R 31/26* | (2020.01) | |
| *G11C 5/14* | (2006.01) | |
| *H02J 7/34* | (2006.01) | |

(Continued)

(52) U.S. Cl.
CPC ......... *G01R 31/40* (2013.01); *G01R 31/2607* (2013.01); *G01R 31/64* (2020.01); *G11C 5/143* (2013.01); *G11C 5/147* (2013.01); *G11C 16/349* (2013.01); *G11C 29/021* (2013.01); *G11C 29/702* (2013.01); *H02J 7/00* (2013.01); *H02J 7/00711* (2020.01); *H02J 7/345* (2013.01); *G11C 2029/0409* (2013.01)

(58) Field of Classification Search
CPC .................................... H02J 1/00; H02M 1/00
See application file for complete search history.

(56) References Cited

U.S. PATENT DOCUMENTS

| | | | |
|---|---|---|---|
| 9,214,198 B2 | 12/2015 | Ellis et al. | |
| 2006/0038543 A1* | 2/2006 | Hazucha | H02M 3/1584 |
| | | | 323/282 |

(Continued)

FOREIGN PATENT DOCUMENTS

| | | |
|---|---|---|
| JP | 2016072091 | 5/2016 |
| JP | 2017050999 | 3/2017 |

(Continued)

*Primary Examiner* — Shirley Lu
(74) *Attorney, Agent, or Firm* — Myers Bigel, P.A.

(57) ABSTRACT

Power management apparatuses are provided. A power management apparatus includes a secondary power device that includes at least one capacitor. The power management apparatus includes a charging circuit that includes a direct current (DC)-DC converter and that is configured to supply power to the secondary power device. Moreover, the power management apparatus includes a measuring circuit that is configured to measure a switching profile of the DC-DC converter, and to determine a state of the secondary power device by comparing at least one time period of the switching profile with a reference time. Related memory systems and methods of operation are also provided.

18 Claims, 12 Drawing Sheets

(51) Int. Cl.
*G11C 16/34* (2006.01)
*G11C 29/00* (2006.01)
*H02J 7/00* (2006.01)
*G01R 31/64* (2020.01)
*G11C 29/04* (2006.01)

(56) References Cited

U.S. PATENT DOCUMENTS

| | | |
|---|---|---|
| 2013/0175972 A1 | 7/2013 | Akiyama |
| 2015/0120084 A1 | 4/2015 | List et al. |
| 2015/0329009 A1 | 11/2015 | Dente |
| 2015/0330116 A1 | 11/2015 | Dente |
| 2016/0116925 A1* | 4/2016 | Freeman ........... H02M 3/33546 307/130 |
| 2016/0336748 A1* | 11/2016 | Andrieu .................... H02J 3/02 |
| 2017/0067968 A1 | 3/2017 | Lee et al. |
| 2017/0201100 A1 | 7/2017 | Mumtaz |

FOREIGN PATENT DOCUMENTS

| | | |
|---|---|---|
| KR | 10-1019342 | 2/2011 |
| KR | 10-1701425 | 1/2017 |

\* cited by examiner

MEMORY SYSTEMS AND POWER MANAGEMENT APPARATUSES INCLUDING SECONDARY POWER DEVICES, AND RELATED METHODS OF OPERATION

CROSS-REFERENCE TO RELATED APPLICATION

This application claims the benefit of Korean Patent Application No. 10-2017-0161005, filed on Nov. 28, 2017, in the Korean Intellectual Property Office, the disclosure of which is hereby incorporated herein in its entirety by reference.

BACKGROUND

The present disclosure relates to power devices and, more particularly, to secondary power devices that secondarily supply power, and to memory systems including the secondary power devices. In general, a memory system including memory devices and a memory controller operates by receiving power from an external source. In this regard, a sudden power off (SPO) situation in which the power (e.g., main/primary power) is suddenly discontinued while the memory system operates may occur. In this case, because the memory controller may store data by using a volatile memory, the data stored in the volatile memory may be at risk of being lost and/or a memory device may be at risk of not completing its operation (e.g., an erase operation, a write operation, etc.). Accordingly, in response to an SPO situation, the memory system may attempt to complete an ongoing operation by using a secondary power device, and/or may perform an operation of backing up the data. Moreover, it may be desirable to verify the health of the secondary power device, to ensure that it is capable of adequately providing power.

SUMMARY

The present inventive concepts may provide a monitoring apparatus and method of monitoring a secondary power device, and a memory system including the monitoring apparatus, such that a state of the secondary power device is efficiently monitored.

According to some embodiments of the inventive concepts, a power management apparatus is provided. The power management apparatus may include a secondary power device that includes at least one capacitor. The power management apparatus may include a charging circuit that includes a direct current (DC)-DC converter and that is configured to supply power to the secondary power device. Moreover, the power management apparatus may include a measuring circuit that is configured to measure a switching profile of the DC-DC converter, and to determine a state of the secondary power device by comparing at least one time period of the switching profile with a reference time.

A power management apparatus, according to some embodiments of the inventive concepts, may include a secondary power device that includes a plurality of capacitors that are connected in parallel. The power management apparatus may include a direct current (DC)-DC converter that includes a field effect transistor (FET) as a switching device and that is configured to supply power to the secondary power device. The power management apparatus may include a measuring circuit that is configured to measure a switching profile of the DC-DC converter, and to determine a state of the secondary power device by comparing at least one time period of the switching profile with a reference time. Moreover, the power management apparatus may include a control circuit configured to control the DC-DC converter.

A memory system, according to some embodiments of the inventive concepts, may include a power loss protection (PLP) system that includes a secondary power device that includes a plurality of capacitors that are connected in parallel, and a direct current (DC)-DC converter that is configured to supply power to the secondary power device. The memory system may include a main system including a control circuit and at least one memory chip. Moreover, the memory system may include a power circuit that is between the PLP system and the main system, and that is configured to supply power to the main system. One of the PLP system or the main system may include a measuring circuit that is configured to monitor the secondary power device, based on a switching profile of the DC-DC converter.

A method of power management of a secondary power device, according to some embodiments of the inventive concepts, may include charging the secondary power device by supplying power to the secondary power device via a direct current (DC)-DC converter. The method may include measuring a switching profile of the DC-DC converter. Moreover, the method may include determining a state of the secondary power device by comparing at least one time period of the switching profile with a reference time. The state of the secondary power device may be monitored, by the determining, in real time without discharging all of the plurality of capacitors or changing an operation mode of a memory system that is a power supply target of the secondary power device.

BRIEF DESCRIPTION OF THE DRAWINGS

Embodiments of the inventive concepts will be more clearly understood from the following detailed description taken in conjunction with the accompanying drawings in which.

DETAILED DESCRIPTION

Figure 1:
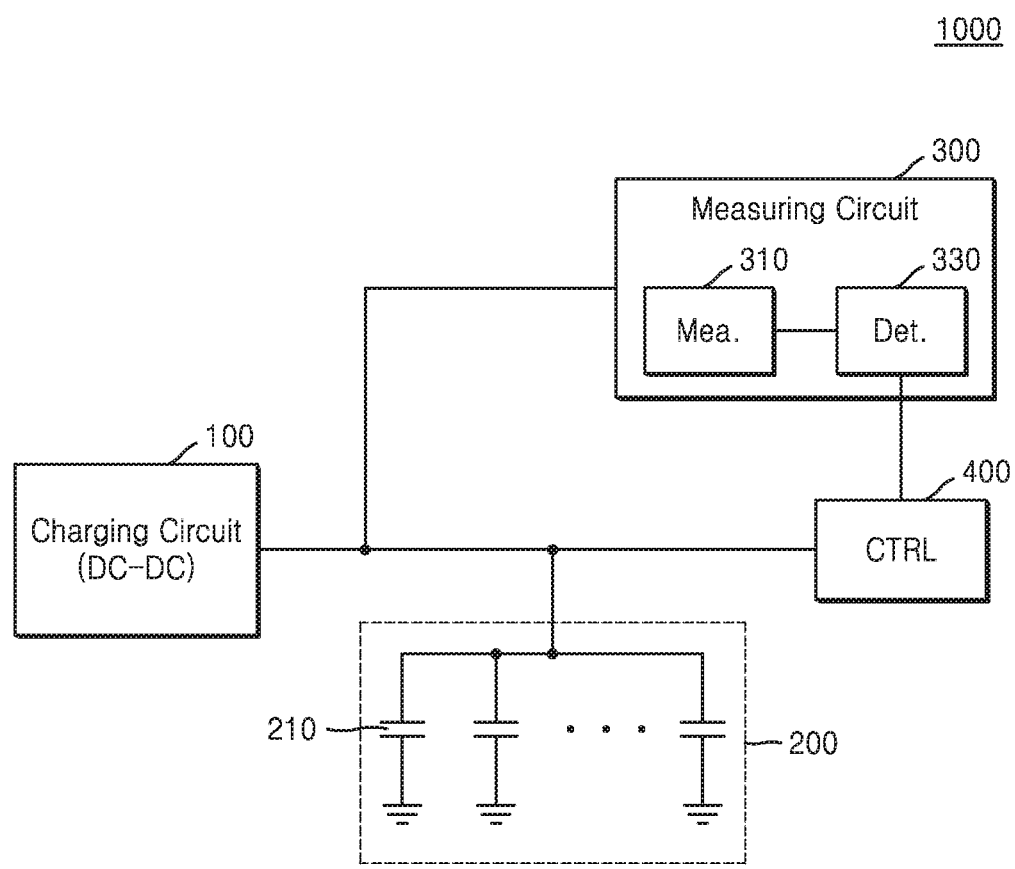
FIG. 1 is a block diagram illustrating a structure of a monitoring apparatus configured to monitor a secondary power device, according to some embodiments.

Hereinafter, the inventive concepts will be described in detail by explaining embodiments of the inventive concepts with reference to the attached drawings. Like reference numerals in the drawings denote like elements, and redundant explanations of like elements may be omitted.

FIG. 1 is a block diagram illustrating a structure of a monitoring apparatus 1000 configured to monitor a secondary power device 200, according to some embodiments.

Referring to FIG. 1, the monitoring apparatus (or monitoring system) 1000 according to some embodiments may include a charging circuit 100, the secondary power device 200, a measuring circuit 300, and a control ("CTRL") circuit 400. Although the term "monitoring" is used herein to describe examples of the apparatus/system 1000, the apparatus/system 1000 is not limited thereto and may also be a "power management," "power control," or "backup power" apparatus/system.

The charging circuit 100 includes a direct current (DC)-DC converter, and may supply power to the secondary power device 200. In more detail, as illustrated, the secondary power device 200 may have a structure in which at least two capacitors 210 are connected in parallel. The charging circuit 100 may charge the capacitors 210 by supplying power to the secondary power device 200. When charge is stored in the capacitors 210 due to charging by the charging circuit 100 and thus a voltage of the capacitors 210 reaches a set (e.g., predetermined) second voltage, the charging by the charging circuit 100 is stopped. When the charging is stopped, self-discharge by which the charge is reduced in the capacitors 210 occurs, such that the voltage of the capacitors 210 is gradually decreased. When the voltage of the capacitors 210 is gradually decreased and then reaches a set (e.g., predetermined) first voltage, a charging operation of the charging circuit 100 is resumed and the capacitors 210 of the secondary power device 200 may be charged again.

The charging operation of the charging circuit 100 may be repeatedly performed at regular intervals, when a state of the secondary power device 200 is normal. However, when the state of the secondary power device 200 is abnormal (e.g., when a short defect or an open defect has occurred in some capacitors among the capacitors 210 of the secondary power device 200), the charging operation of the charging circuit 100 may become different, compared to that of when the state of the secondary power device 200 is normal. Therefore, the state of the secondary power device 200 may be determined by measuring and analyzing the charging operation of the charging circuit 100. The charging operation of the charging circuit 100 may be represented as a switching profile of the DC-DC converter. Accordingly, the state of the secondary power device 200 may be determined by measuring and analyzing the switching profile of the DC-DC converter. A detailed structure of the charging circuit 100 will be described with reference to FIGS. 2A and 2B, and the measuring and analyzing of the switching profile of the DC-DC converter will be described in detail with reference to FIGS. 5A through 5D.

As described above, the secondary power device 200 may include at least two capacitors 210 that are connected in parallel. However, a structure of the secondary power device 200 is not limited thereto. For example, in some embodiments, a structure of the secondary power device 200 that will be described in detail with reference to FIGS. 3A and 3B may be used. As illustrated, the secondary power device 200 may include only the capacitors 210 and may not include a separate load. Accordingly, when a defect occurs in one of the capacitors 210, ripple variation in a voltage of each capacitor 210 (hereinafter, referred to as the capacitor 210) due to the load may not occur.

The capacitor 210 may be classified as an electrolyte capacitor, a film capacitor, a tantalum capacitor, a ceramic capacitor, or the like based on dielectric materials.

The electrolyte capacitor may include a thin oxide film as a dielectric, and aluminum as electrodes, thereby being called an aluminum (Al) capacitor. The electrolyte capacitor has a good low frequency characteristic, and may be embodied to have a high capacity of tens of thousands of microfarads (µF). The tantalum capacitor may have electrodes formed of tantalum (Ta) and may have excellent temperature and frequency characteristics compared to those of the electrolyte capacitor.

The film capacitor may have a structure in which a film dielectric such as polypropylene, polystyrol/polystyrene, or Teflon is rolled up between electrodes formed of Al or copper. A capacity and use of the film capacitor may vary based on materials and manufacturing processes. A Mylar® capacitor, which may be a relatively inexpensive film capacitor, may be made by inserting a polyester film into metal and then winding the polyester film and the metal into a cylinder shape and may be mainly used in a high frequency circuit, an oscillation circuit, or the like.

The ceramic capacitor may include a high dielectric constant material such as titanium-barium as a dielectric. The ceramic capacitor has a good high frequency characteristic and may be configured to pass noise to ground. A multi-layer ceramic condenser (MLCC) that is a type of the ceramic capacitor may include a multilayered high dielectric constant ceramic structure as a dielectric between electrodes. Because the MLCC has excellent temperature and frequency characteristics and is small, the MLCC may be mainly used as a by-pass.

In the monitoring apparatus 1000, the capacitor 210 included in the secondary power device 200 may be embodied as the tantalum capacitor, the Al capacitor, or the MLCC, which has low equivalent series resistance (ESR). However, a material of the capacitor 210 of the secondary power device 200 is not limited to the aforementioned materials.

When a sudden power off (SPO) situation in which power supply from an external source to an electronic system, e.g., a memory system, which is a power supply target, is discontinued occurs, the secondary power device 200 may allow the memory system to complete an ongoing operation and perform a data backup operation by supplying, as power, stored energy in the secondary power device 200 to the memory system. However, in the case that a defect occurs in the secondary power device 200, the secondary power device 200 may be unable to supply sufficient/appropriate power to the memory system in the SPO situation, such that a heavy data loss may occur in the memory system. Thus, in order to inhibit/prevent a data loss in the memory system in the SPO situation, it may be beneficial to monitor the secondary power device 200 periodically or in real time and to check a state of the secondary power device 200, and in the case that the defect is detected, it may be beneficial to repair or replace the secondary power device 200.

The measuring circuit 300 may determine the state of the secondary power device 200 by measuring and analyzing a charging operation of the charging circuit 100. For example, the charging operation of the charging circuit 100 may be represented as a switching profile of the DC-DC converter, and the measuring circuit 300 may determine the state of the secondary power device 200 by measuring and analyzing the switching profile of the DC-DC converter. The measuring circuit 300 may include a measurer ("Mea.") 310 and a determiner ("Det.") 330. The measurer 310 may measure the switching profile of the DC-DC converter. The determiner 330 may determine the state of the secondary power device 200 by analyzing the measured switching profile of the DC-DC converter. A configuration of the measurer 310 will be described in detail with reference to FIGS. 4A and 4B, and an operation of the determiner 330 will be described in detail with reference to FIGS. 5A through 5D.

The control circuit 400 may control the charging circuit 100, based on a result received from the determiner 330. In this regard, the control with respect to the charging circuit 100 may indicate that, when a defect occurs in the secondary power device 200, a charging condition of the charging circuit 100 may be changed to maintain the state of the secondary power device 200 close to a normal state. In addition, when the defect occurs in the secondary power device 200, the control circuit 400 may change a memory-write operation mode of the electronic system, e.g., the memory system, which is the power supply target, thereby allowing data to be stored in real time in a main memory. For example, in the monitoring apparatus 1000, when the defect occurs in the secondary power device 200, the control circuit 400 may change a write-back (write-behind) mode of the memory system to a write-through mode.

In this regard, the memory-write operation mode may include the write-back mode and the write-through mode. In the write-back mode, data is first written to cache, and the data stored in the cache is written to the main memory only when the data is required. Thus, the write-back mode may indicate a mode in which data is recorded in a background operation using central processing unit (CPU) wait-state time of a CPU. The write-through mode may indicate a mode in which the cache and the main memory simultaneously process a data write operation in a parallel-manner, and the data write operation is immediately performed, not in an idle time. In the write-through mode, when a data read operation with respect to the cache is requested during the data write operation with respect to the cache, the data write operation and the data read operation are simultaneously processed. On the other hand, in the write-back mode, when the data read operation is requested during the data write operation, the data write operation is stopped and then is resumed after the data read operation is ended.

When the state of the secondary power device 200 is normal, the write-back mode, which may be excellent in terms of efficiency, may be generally used. However, when the state of the secondary power device 200 is abnormal during the write-back mode, a data loss may occur. Thus, the control circuit 400 may reduce/minimize the data loss by changing a memory write mode from the write-back mode to the write-through mode.

Furthermore, when the defect occurs in the secondary power device 200, the control circuit 400 may notify the defect to a user by generating an alarm signal, thereby helping/making the user repair or replace the secondary power device 200.

The monitoring apparatus 1000 according to some embodiments may monitor the state of the secondary power device 200 in real time by measuring and analyzing in real time the charging operation of the charging circuit 100 via the measuring circuit 300. In this regard, the charging operation of the charging circuit 100 may be represented as the switching profile of the DC-DC converter, and the measuring circuit 300 may measure the switching profile of the DC-DC converter.

The monitoring apparatus 1000 according to some embodiments monitors the state of the secondary power device 200, based on the charging operation of the charging circuit 100, which is naturally performed. Thus, the monitoring apparatus 1000 may not perform a forced-discharge (e.g., an irregular discharge) operation on the capacitor 210 (e.g., all of the capacitors 210) of the secondary power device 200. Thus, the memory system that is the power supply target of the secondary power device 200 may be stably maintained. For example, in the case that the forced-discharge operation is performed on the capacitor 210 so as to monitor the state of the secondary power device 200, if the SPO situation occurs during the forced-discharge operation, a data loss may not be prevented.

In this regard, the memory-write operation mode may be changed by taking into account the occurrence of the SPO situation during the forced-discharge operation. However, because the memory-write operation mode is changed in advance regardless of the state of the secondary power device 200, operation efficiency of the memory system may deteriorate. However, the monitoring apparatus 1000 according to some embodiments does not require the forced-discharge operation with respect to the capacitor 210. Thus, it may not be necessary to change the memory-write operation mode during a monitoring operation with respect to the secondary power device 200, such that deterioration in the operation efficiency of the memory system may be inhibited/prevented.

Figure 2A:
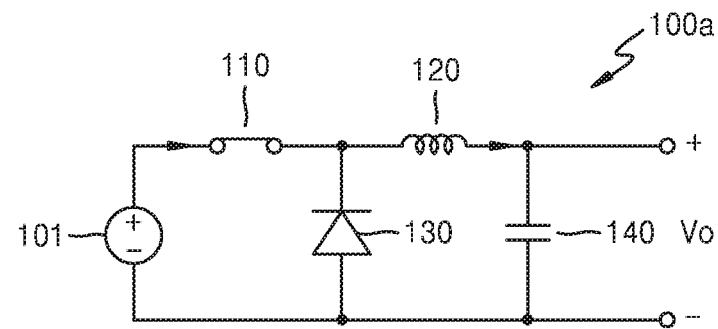
FIGS. 2A and 2B are circuit diagrams illustrating a direct current (DC)-DC converter of a charging circuit in the monitoring apparatus of FIG. 1, according to some embodiments.
Figure 2A:
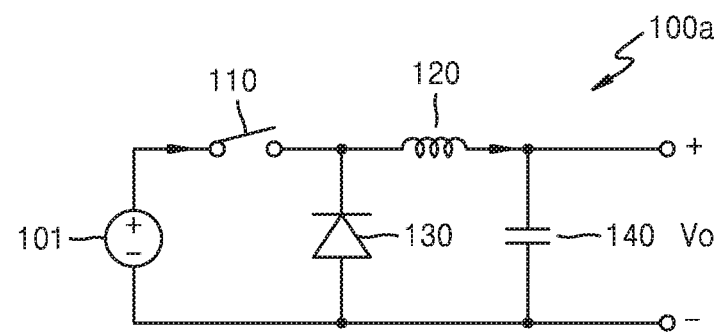
Figure 2B:
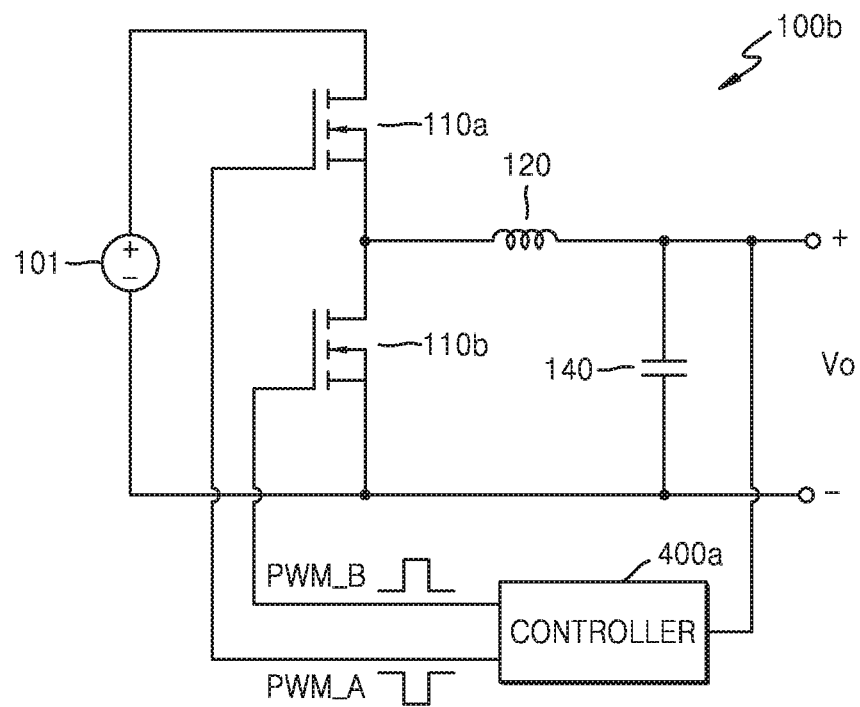

FIGS. 2A and 2B are circuit diagrams illustrating the DC-DC converter of the charging circuit 100 in the monitoring apparatus 1000 of FIG. 1. FIG. 2A illustrates a simplified structure/representation of a buck converter, and FIG. 2B illustrates an actual/detailed structure of the buck converter. For convenience of understanding, descriptions are provided with reference to FIG. 1 (i.e., elements illustrated in FIG. 1 may be referenced/described).

Referring to FIGS. 2A and 2B, in the monitoring apparatus 1000 according to some embodiments, the charging circuit 100 may be formed as the DC-DC converter. However, the charging circuit 100 is not limited to the DC-DC converter. For example, a buffer circuit including a switching device may be used as the charging circuit 100.

The DC-DC converter may be generally classified as a boost converter or a buck converter, and in this regard, the boost converter is a converter configured to step up input DC power and output increased power, and the buck converter is a converter configured to step down input DC power and output reduced power. As illustrated in FIG. 2A, in the monitoring apparatus 1000 according to some embodiments, the charging circuit 100 may be formed as a buck converter 100a, and the buck converter 100a may include a switch 110, an inductor 120, a diode 130, and a capacitor 140. As illustrated, the capacitor 140 may be included in the buck converter 100a. Alternatively, the capacitor 140 may be a part of the secondary power device 200 to be charged. Briefly describing an operation of the buck converter 100a, when the switch 110 is closed as in the top structure of FIG. 2A, current is applied from a power source 101 to the inductor 120, such that the current flowing the inductor 120 is increased and thus energy is stored in the inductor 120, and then the energy is delivered to an output terminal, whereby an output voltage Vo, i.e., a voltage of the capacitor 140, is increased. In this regard, the diode 130 is reverse-biased such that the current does not flow to the diode 130. Next, as in the bottom structure of FIG. 2A, when the switch 110 is opened, a closed circuit is formed by the inductor 120, the diode 130, and the capacitor 140. In this regard, current flowing in the inductor 120 is gradually decreased while flowing in the closed circuit, whereby an output voltage Vo, i.e., a voltage of the capacitor 140, is decreased. This may correspond to self-discharge in terms of the capacitor 140. An average voltage of the output voltage Vo may be controlled according to a ratio of a closed state to an open state with respect to the switch 110. In addition, when the switch 110 is closed, a maximum output voltage may be obtained, and the output voltage Vo may be always equal to or less than an input voltage. The switch 110 may be formed as a field effect transistor (FET) that is easily controlled. The control with respect to the switch 110 will now be described in detail with the description of a buck converter 100b of FIG. 2B below.

As illustrated in FIG. 2B, the buck converter 100b may include a pair of switches 110a and 110b (also referred to as first and second switches 110a and 110b), the inductor 120, and the capacitor 140. In this regard, the pair of switches 110a and 110b may be formed as the same n-type FETs. However, the inventive concepts are not limited thereto. For example, the pair of switches 110a and 110b may be respectively formed as an n-type FET and a p-type FET, and in this case, the same pulse width modulation (PWM) signals may be respectively input to the pair of switches 110a and 110b.

Briefly describing an operation of the buck converter 100b, the buck converter 100b may operate in two modes according to an On or Off state of each of the switches 110a and 110b. For example, a first mode is an operation mode in which the first switch 110a is switched-on, and the second switch 110b is switched-off, and during the first mode, current is applied from the power source 101 to the inductor 120, such that the current flowing in the inductor 120 is increased and thus energy is stored in the inductor 120, and then the energy is delivered to an output terminal, whereby an output voltage Vo, i.e., a voltage of the capacitor 140, is increased. A second mode is an operation mode in which the first switch 110a is switched-off, and the second switch 110b is switched-on, and during the second mode, a closed circuit is formed by the inductor 120 and the capacitor 140. In this regard, current flowing in the inductor 120 is gradually decreased while flowing in the closed circuit until the first switch 110a is switched-on in a next time period, whereby an output voltage Vo is decreased.

Based on this principle, a control circuit ("CONTROLLER") 400a detects the output voltage Vo, and when the output voltage Vo is low, the control circuit 400a may increase the output voltage Vo by increasing a connected time of the first switch 110a and decreasing a connected time of the second switch 110b. In addition, when the output voltage Vo is high, the control circuit 400a may decrease the output voltage Vo by decreasing the connected time of the first switch 110a and increasing the connected time of the second switch 110b. For example, the control circuit 400a may maintain a constant level of voltage at the capacitor 140 by adjusting, based on the output voltage Vo, a duty ratio of the PWM signals respectively output to the switches 110a and 110b.

Figure 3A:
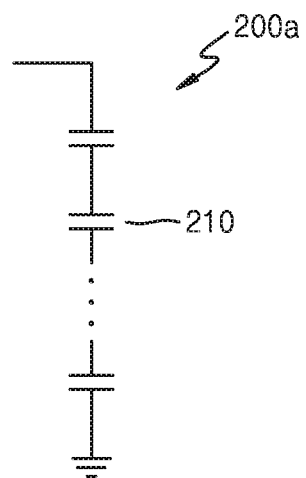
FIGS. 3A and 3B are circuit diagrams illustrating a structure of the secondary power device in the monitoring apparatus of FIG. 1, according to some embodiments.
Figure 3B:
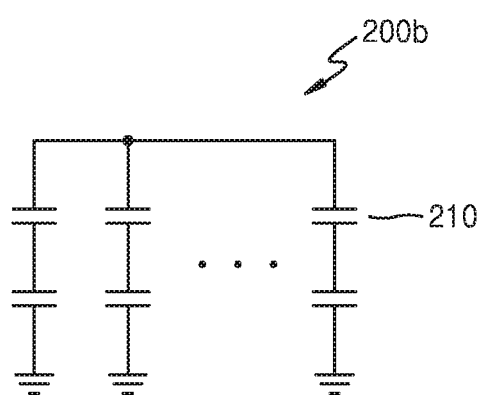

FIGS. 3A and 3B are circuit diagrams illustrating a structure of the secondary power device 200 in the monitoring apparatus 1000 of FIG. 1, according to some embodiments. For convenience of understanding, descriptions are provided with reference to FIG. 1 (i.e., elements illustrated in FIG. 1 may be referenced/described).

Referring to FIG. 3A, in the monitoring apparatus 1000 according to some embodiments, a secondary power device 200a may be formed of at least two serially-connected capacitors 210. In general, when the capacitors 210 are serially connected, a collective/aggregate voltage of a group of the capacitors 210 may be increased. Thus, a secondary power device 200a having a high voltage may be embodied by serially connecting capacitors 210 each having a small capacity. When the capacitors 210 are connected in parallel, a capacity of a group of the capacitors 210 may be increased such that an amount of charge to be stored may be increased.

Referring to FIG. 3B, in the monitoring apparatus 1000 according to some embodiments, a secondary power device 200b may be formed of a plurality of capacitors 210 that are connected in series and parallel. As described above, a voltage of a group of the capacitors 210 may be increased by serially connecting the capacitors 210, and a capacity of a group of the capacitors 210 may be increased by connecting the capacitors 210 in parallel. Accordingly, in the monitoring apparatus 1000 according to some embodiments, the plurality of capacitors 210 are connected in series and parallel such that a voltage and a capacity of a group of the capacitors 210 may be increased. In the secondary power device 200b of FIG. 3B, two capacitors 210 are serially connected, but the inventive concepts are not limited thereto, and thus at least three capacitors 210 may be serially connected. In addition, the secondary power device 200b is not limited to a structure in which serially-connected capacitors 210 are connected in parallel, and thus may have a structure in which parallel-connected capacitors 210 are serially connected.

In the monitoring apparatus 1000 according to some embodiments, the secondary power device 200, 200a, or 200b may be applied to an electronic device, e.g., a memory module, which uses relatively high backup energy. Accordingly, the secondary power device 200, 200a, or 200b may have a structure in which a plurality of capacitors are parallel-connected and may have a high capacitor capacity. For example, the secondary power device 200, 200a, or 200b may have a high capacitor capacity ranging from several hundreds of microfarads (μF) to several mF. For example, the secondary power device 200, 200a, or 200b may be applied to a solid state drive (SSD) module using backup energy of at least 10 megajoules (mJ), and thus, the monitoring apparatus 1000 may be included in the SSD module and may monitor a secondary power device. However, examples of the electronic device to which the secondary power device 200, 200a, or 200b is applied are not limited to the SSD module.

Figure 4A:
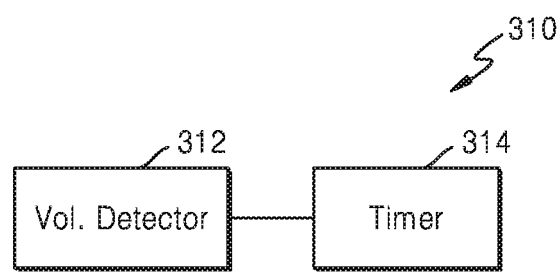
FIGS. 4A and 4B are block diagrams further illustrating a measurer of a measuring circuit in the monitoring apparatus of FIG. 1, according to some embodiments.
Figure 4B:
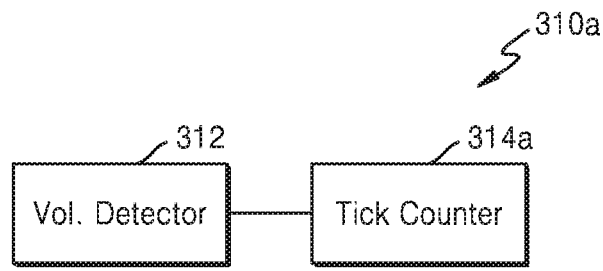

FIGS. 4A and 4B are block diagrams further illustrating the measurer 310 of the measuring circuit 300 in the monitoring apparatus 1000 of FIG. 1. For convenience of understanding, descriptions are provided with reference to FIG. 1 (i.e., elements illustrated in FIG. 1 may be referenced/described).

Referring to FIG. 4A, in the monitoring apparatus 1000 according to some embodiments, the measurer 310 of the measuring circuit 300 may include a voltage ("Vol.") detector 312 and a timer 314. The voltage detector 312 may measure an output voltage of the charging circuit 100 or a voltage of the secondary power device 200. In more detail, the voltage detector 312 may detect a first voltage (refer to 'B' in the graph of FIG. 5A) of the secondary power device 200 when charging of the secondary power device 200 is started, and a second voltage (refer to 'A' in the graph of FIG. 5A) of the secondary power device 200 when charging of the secondary power device 200 is completed.

The charging circuit 100 may automatically perform a charging operation, based on a voltage level of the secondary power device 200. In other words, the charging circuit 100 may perform the charging operation on the secondary power device 200, based on a preset/predetermined voltage condition. For example, in the case that the first voltage of the secondary power device 200 is set as a charging start voltage, and the second voltage of the secondary power device 200 is set as a charging end voltage, when the secondary power device 200 is self-discharged and thus reaches the first voltage, the charging circuit 100 starts a charging operation with respect to the secondary power device 200. Afterward, when a voltage of the secondary power device 200 reaches the second voltage that is the charging end voltage, due to the charging operation of the charging circuit 100, the charging circuit 100 ends the charging operation. In the case that a state of the secondary power device 200 is normal, the charging operation of the charging circuit 100 may be periodically and repeatedly performed between the first voltage and the second voltage.

When the voltage detector 312 of the measurer 310 detects the first voltage and the second voltage of the secondary power device 200, the timer 314 may measure a time of a charging period and/or a discharging period by the charging circuit 100. In more detail, the charging period may refer to a time period in which a voltage of the secondary power device 200 rises from the first voltage to the second voltage, and may correspond to an ON period of an FET (refer to the FET 110a FIG. 2B) of the DC-DC converter of the charging circuit 100. The discharging period may refer to a time period in which a voltage of the secondary power device 200 falls from the second voltage to the first voltage, and may correspond to an OFF period of the FET of the DC-DC converter of the charging circuit 100. Hereinafter, for convenience of description, the ON period of the FET of the DC-DC converter is abbreviated to the ON period of the FET, and the OFF period of the FET of the DC-DC converter is abbreviated to the OFF period of the FET.

When a time of the ON period of the FET and/or the OFF period of the FET is measured by the timer 314, the determiner 330 may determine whether a state of the secondary power device 200 is normal or abnormal. In other words, as described above, in the case that the state of the secondary power device 200 is normal, the charging operation of the charging circuit 100 may be periodically and repeatedly performed between the first voltage and the second voltage. Thus, a time of the ON period of the FET, which corresponds to the charging period, and a time of the OFF period of the FET, which corresponds to the discharging period, may respectively have set/predetermined values. Accordingly, a time of the ON period of the FET and/or the OFF period of the FET is measured with respect to the secondary power device 200 whose state is normal, and then is set as a reference time, and a measured time of the ON period of the FET and/or the OFF period of the FET is compared with the reference time, such that whether a state of the secondary power device 200 is normal may be determined. In some embodiments, the reference time may be previously input without a separate setting process.

The determiner 330 may compare the measured time of the ON period of the FET and/or the OFF period of the FET with the reference time, and then may determine that the state of the secondary power device 200 is normal when a difference between the measured time and the reference time is equal to or less than a set/predetermined range, and may determine that the state of the secondary power device 200 is abnormal when the difference between the measured time and the reference time is greater than the set/predetermined range. For example, the set/predetermined range with respect to the difference between the measured time and the reference time may be ±5%. However, the set/predetermined range is not limited to the above value.

The reference time may be set for each of an ON reference time with respect to the ON period of the FET and an OFF reference time with respect to the OFF period of the FET, or may be set for one of the ON reference time and the OFF reference time. The determination, by the determiner 330, on whether a state of the secondary power device 200 is normal may be achieved by comparing a measured time of the ON period of the FET with the ON reference time or comparing a measured time of the OFF period of the FET with the OFF reference time. In addition, in some embodiments, the determination may be achieved by performing both the comparison between the measured time of the ON period of the FET and the ON reference time and the comparison between the measured time of the OFF period of the FET and the OFF reference time.

Referring to FIG. 4B, in the monitoring apparatus 1000 according to some embodiments, a measurer 310a of the measuring circuit 300 may include a voltage detector 312 and a tick counter 314a. The voltage detector 312 may measure a voltage of the secondary power device 200. In more detail, the voltage detector 312 may detect a first voltage (refer to B voltage in FIG. 5A) of the secondary power device 200 when charging of the secondary power device 200 is started, and a second voltage (refer to A voltage in FIG. 5A) of the secondary power device 200 when charging of the secondary power device 200 is completed.

As the timer 314 of the measurer 310 in FIG. 4A, the tick counter 314a may measure a time of an ON period of the FET and/or an OFF period of the FET. In general, an operating system (OS) uses a time unit called a 'tick' during a process such as scheduling. An interval between ticks is normally between about 1 millisecond (ms) and about 10 ms, and a time of a corresponding period may be measured by counting the number of ticks. For example, in the case that an interval between ticks is 1 ms and 20 ticks are counted within a period to be measured, a time of the period may be determined to be 20 ms.

Accordingly, in the monitoring apparatus 1000 according to some embodiments, the measurer 310a of the measuring circuit 300 may measure a time of the ON period of the FET and/or the OFF period of the FET by counting ticks in the ON period of the FET and/or the OFF period of the FET by using the tick counter 314a. In a similar manner to descriptions about the measurer 310 of FIG. 4A, the determiner 330 may compare the number of ticks counted by the tick counter 314a with a reference number, thereby determining whether a state of the secondary power device 200 is normal or abnormal. The setting of the reference number and a set/predetermined range with respect to a difference between the number of counted ticks and the reference number may be the same as described herein with respect to the setting of the reference time and the set/predetermined range with respect to a difference between the measured time and the reference time in FIG. 4A.

Figure 5A:
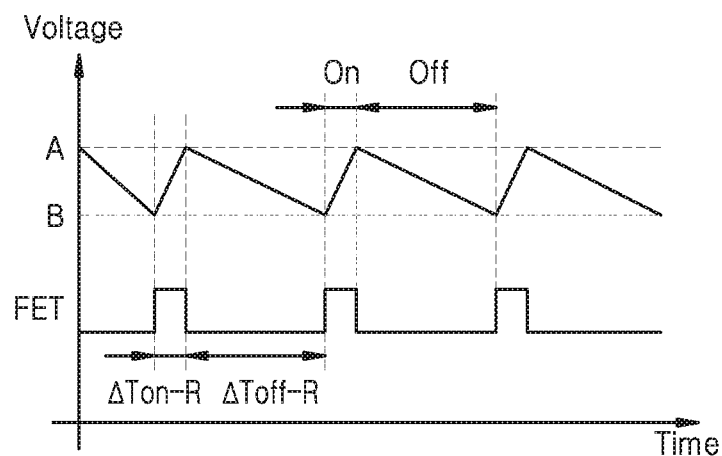
FIG. 5A illustrates a graph showing a voltage profile of the secondary power device and an ON-OFF profile of a field effect transistor (FET) when a state of the secondary power device is normal.
Figure 5B:
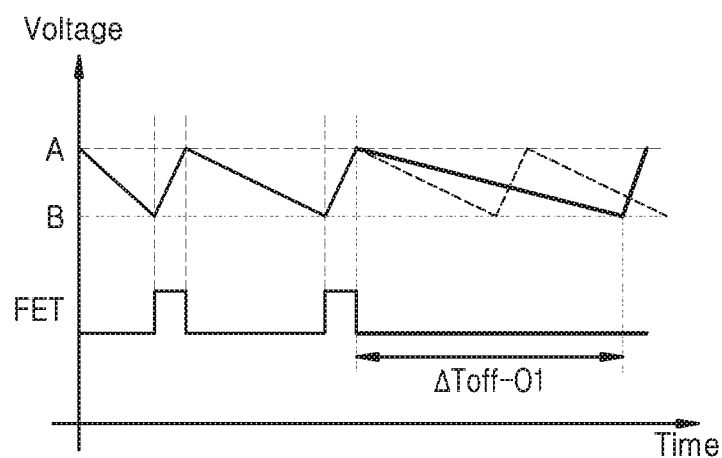
FIGS. 5B through 5D illustrate graphs showing a voltage profile of the secondary power device and an ON-OFF profile of the FET when the state of the secondary power device is abnormal.
Figure 5C:
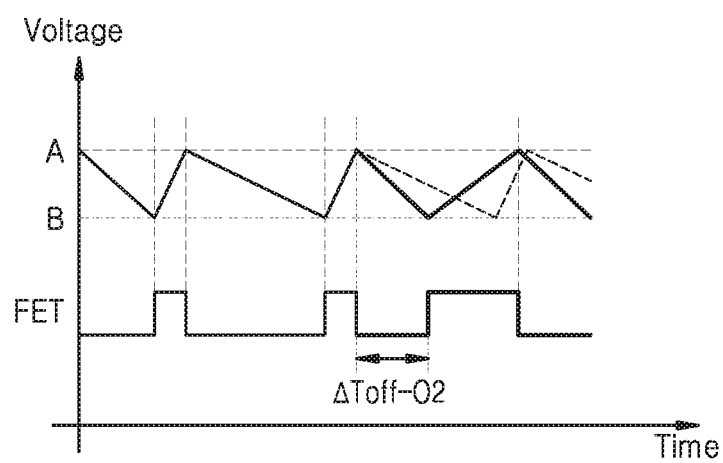
Figure 5D:
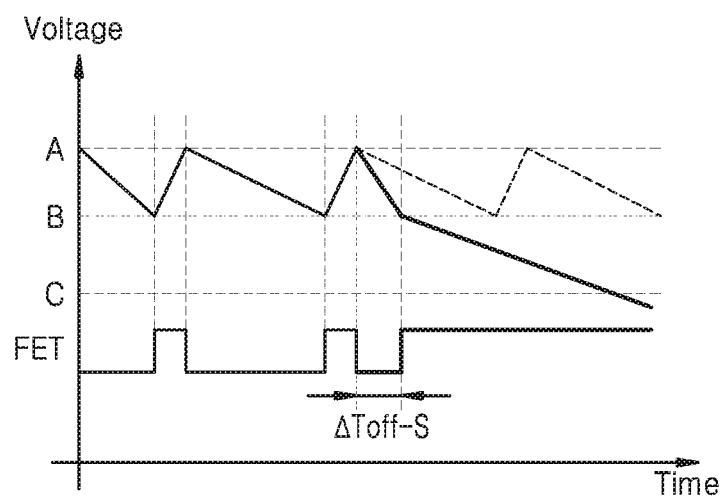

FIG. 5A illustrates a graph showing a voltage profile of the secondary power device 200 and an ON-OFF profile of the FET when a state of the secondary power device 200 is normal, and FIGS. 5B through 5D illustrate graphs showing a voltage profile of the secondary power device 200 and an ON-OFF profile of the FET when the state of the secondary power device 200 is abnormal. In the graphs, the x-axis indicates a time, the y-axis indicates a voltage, and a unit may be an arbitrary unit. A mark A on the y-axis refers to a second voltage of the secondary power device 200 when charging by the charging circuit 100 is completed, and a mark B thereon refers to a first voltage of the secondary power device 200 when charging by the charging circuit 100 is started. For convenience of understanding, descriptions are provided with reference to FIG. 1.

Referring to FIG. 5A, when a state of the secondary power device 200 is normal, a voltage of the secondary power device 200 may periodically repeat rising and falling between the first voltage B and the second voltage A. Accordingly, a time of a rising period and a time of a falling period may be constant/consistent based on respective cycles. In this regard, the rising period may correspond to a charging period, and the falling period may correspond to a discharging period. In addition, the charging period may correspond to an ON period of an FET (refer to the FET 110a FIG. 2B), and the discharging period may correspond to an OFF period of the FET.

A voltage of the secondary power device 200 may correspond to an output voltage from the charging circuit 100. Also, the voltage of the secondary power device 200 may correspond to a voltage of all of the capacitors 210. The switching profile of the charging circuit 100 or the DC-DC converter may include the ON-OFF profile of the FET and a voltage profile of the capacitor 210 (e.g., an aggregate/collective voltage profile that accounts for all of the plurality of capacitors 210).

When a state of the secondary power device 200 is normal, as illustrated in the lower portion of the graph of an FET, a time of an ON period of the FET may correspond to an ON reference time ($\Delta$Ton-R), and a time of an OFF period of the FET may correspond to an OFF reference time ($\Delta$Toff-R). The ON reference time ($\Delta$Ton-R) and the OFF reference time ($\Delta$Toff-R) may be constantly/consistently maintained in every cycle.

In other words, in the case that a state of the secondary power device 200 is not known, when a time of the ON period of the FET and/or the OFF period of the FET, which is measured by the measurer 310 of the measuring circuit 300, is substantially the same as the ON reference time ($\Delta$Ton-R) or the OFF reference time ($\Delta$Toff-R), it is possible to determine that the state of the secondary power device 200 is normal.

Referring to FIG. 5B, when the state of the secondary power device 200 is abnormal, the voltage of the secondary power device 200 may stray (e.g., may be irregular) from a pattern in which the voltage periodically rises and falls between the first voltage B and the second voltage A. For example, it is assumed that an open defect has occurred in some of the capacitors 210 forming the secondary power device 200 at a point in time where a longer, bold straight line starts in FIG. 5B. In this regard, in some of the capacitors 210 where the open defect has occurred, self-discharge may be slow or fast based on a surrounding environment, and FIG. 5B illustrates a case in which self-discharge is slow.

In the case that self-discharge is slow, a time in which the voltage of the secondary power device 200 falls to the first voltage B, i.e., the OFF period of the FET, is increased. Thus, the measurer 310 of the measuring circuit 300 may measure a time of the OFF period of the FET as a first open off time ($\Delta$Toff-O1). The first open off time ($\Delta$Toff-O1) may be different from the OFF reference time ($\Delta$Toff-R). For example, when it is assumed that a set/predetermined range with respect to a difference is 5%, the first open off time ($\Delta$Toff-O1) may be increased by more than 5%, compared to the OFF reference time ($\Delta$Toff-R). Thus, the determiner 330 may determine that the state of the secondary power device 200 is abnormal.

When self-discharge is slow due to the open defect in some of the capacitors 210, a time of a charging period may be fast. However, a temporal relation between discharging and charging is not limited thereto.

Referring to FIG. 5C, a state of the secondary power device 200 is abnormal, and an open defect has occurred in some of the capacitors 210. However, unlike the case of FIG. 5B, FIG. 5C illustrates a case in which self-discharge is fast.

In more detail, in the case that self-discharge is fast, a time in which a voltage of the secondary power device 200 falls to the first voltage B, i.e., the OFF period of the FET, is decreased. Thus, the measurer 310 of the measuring circuit 300 may measure a time of the OFF period of the FET as a second open off time ($\Delta$Toff-O2). The second open off time ($\Delta$Toff-O2) may be different from the OFF reference time ($\Delta$Toff-R). For example, when it is assumed that a set/predetermined range with respect to a difference is 5%, the second open off time ($\Delta$Toff-O2) may be decreased by more than 5%, compared to the OFF reference time ($\Delta$Toff-R). Thus, the determiner 330 may determine that the state of the secondary power device 200 is abnormal.

When self-discharge is fast due to the open defect in some of the capacitors 210, a time of a charging period may be increased. However, a temporal relation between discharging and charging is not limited thereto.

Referring to FIG. 5D, a state of the secondary power device 200 is abnormal, and a short defect has occurred in some of the capacitors 210. When the short defect occurs in some of the capacitors 210, charge may not be stored in the capacitors 210 but may instead flow away and disappear. Thus, a voltage of the capacitors 210 may continuously fall and then may drop to a ground state. As illustrated in FIG. 1, in the case that the secondary power device 200 consists of parallel-connected capacitors 210, when the short defect occurs in one of the capacitors 210, other ones of the capacitors 210 are affected such that a whole voltage (e.g., an aggregate/collective voltage that accounts for all of the capacitors 210) of the secondary power device 200 may fall and then may drop to a ground state.

In terms of the ON period of the FET and the OFF period of the FET, a short defect in the capacitors 210 will now be described. For example, it is assumed that the short defect has occurred in the capacitor 210 at a point in time where a bold straight line starts in FIG. 5D. When the short defect occurs in the capacitor 210, discharging may rapidly proceed via a path of the short. Thus, the OFF period of the FET may become very short, and the measurer 310 of the measuring circuit 300 may measure a time of the OFF period of the FET as a short off time ($\Delta$Toff-S). The short off time ($\Delta$Toff-S) may be different from the OFF reference time ($\Delta$Toff-R). For example, when it is assumed that a set/predetermined range with respect to a difference is 5%, the short off time ($\Delta$Toff-S) may be decreased by more than 5%, compared to the OFF reference time ($\Delta$Toff-R). Thus, the determiner 330 may determine that the state of the secondary power device 200 is abnormal.

The short off time (ΔToff-S) may indicate a time period in which the second voltage A falls to the first voltage B. In general, when a voltage of the secondary power device 200 reaches the first voltage B, a charging operation of the charging circuit 100 is performed again. That is, the ON period of the FET is generated again. However, even if the charging operation of the charging circuit 100 is performed as illustrated, the voltage of the secondary power device 200 continuously falls. Thus, the charging operation of the charging circuit 100 is maintained, and the ON period of the FET is also maintained.

Even when the determiner 330 determines that the state of the secondary power device 200 is abnormal, it is difficult to recognize whether an open defect has occurred or a short defect has occurred in the capacitor 210 of the secondary power device 200. This is because the second open off time (ΔToff-O2) may be shorter than the OFF reference time (ΔToff-R) even in the open defect in the capacitor 210 as in FIG. 5C. However, as in the open defect in the capacitor 210 in FIG. 5B, in the case that the first open off time (ΔToff-O1) is longer than the OFF reference time (ΔToff-R), it is possible to determine that the open defect has occurred in the capacitor 210.

In the case that the short defect has occurred in the capacitor 210, as illustrated in FIG. 5D, the voltage of the secondary power device 200 may continuously fall after the first voltage B. Thus, when a third voltage C that is lower than the first voltage B is set, and the measurer 310 of the measuring circuit 300 detects the voltage of the secondary power device 200, which corresponds to the third voltage C, it is possible to determine that the short defect has occurred in the capacitor 210 of the secondary power device 200. That is, by adding a detect mechanism with respect to the third voltage C, the open defect in the capacitor 210 as in FIG. 5C and the short defect in the capacitor 210 as in FIG. 5D may be distinguished therebetween.

Accordingly, the monitoring apparatus 1000 according to some embodiments may distinguish between all defective states of the capacitor 210 by adding the detect mechanism with respect to the third voltage C. In addition, when a defect occurs in the secondary power device 200, detailed information about a type of the defect is sent to the control circuit 400, such that the charging circuit 100 may be further efficiently controlled by using the control circuit 400. For example, when the open defect occurs in the capacitor 210, a switching period of the FET or an input voltage to the FET may be adjusted to control the secondary power device 200 to substantially/maximally maintain its normal state. In addition, when the short defect occurs in the capacitor 210, the charging operation of the charging circuit 100 may be discontinued, such that an unnecessary waste of power may be inhibited/prevented. Furthermore, a defective state of the capacitor 210 may be notified to a user via an alarm message or an alarm signal, such that the secondary power device 200 may be rapidly repaired or replaced.

Figure 6A:
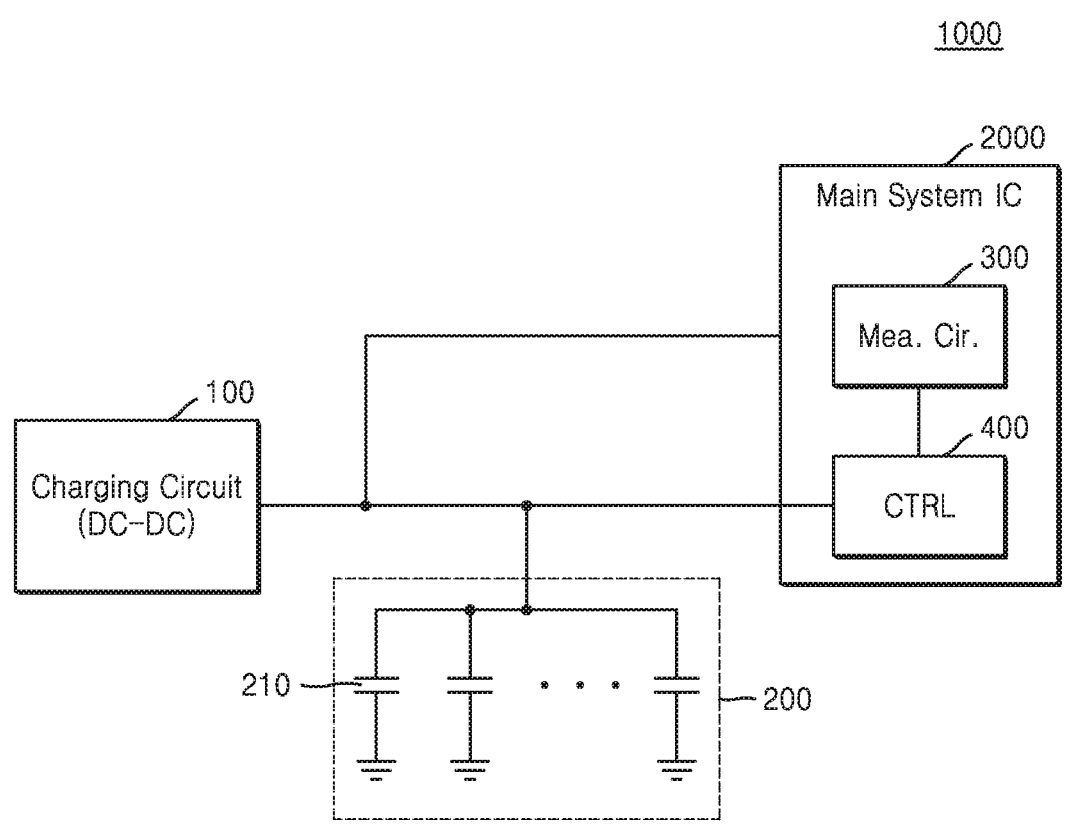
FIGS. 6A and 6B are block diagrams illustrating structures of monitoring apparatuses, according to some embodiments.
Figure 6B:
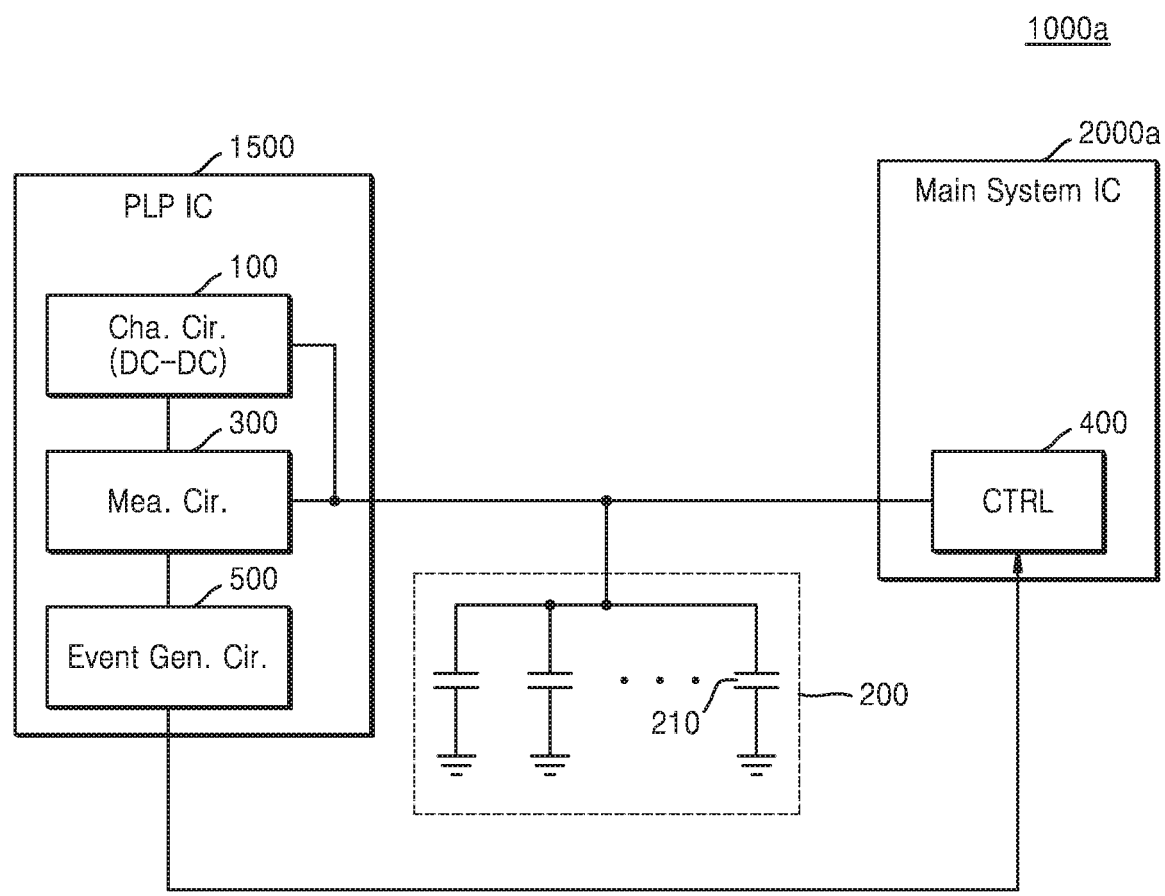

FIGS. 6A and 6B are block diagrams illustrating structures of monitoring apparatuses, according to some embodiments. Descriptions that are provided above with reference to FIGS. 1 through 4B may be briefly provided again or omitted.

Referring to FIG. 6A, in the monitoring apparatus 1000 according to some embodiments, the measuring circuit ("Mea. Cir.") 300 and the control circuit 400 may be integrated together in a main system integrated circuit (IC) 2000 or a main system block. In some embodiments, the charging circuit 100 and the secondary power device 200 may be arranged in an IC or a block which is different from the main system IC 2000.

As described with reference to FIG. 1, the measuring circuit 300 may include the measurer 310 and the determiner 330. Because the measuring circuit 300 is arranged in the main system IC 2000 in the example of FIG. 6A, the measuring circuit 300 may monitor a state of the secondary power device 200 and may directly send information about the state of the secondary power device 200 to the control circuit 400. Thus, a control with respect to the charging circuit 100 may be further rapidly performed by using the control circuit 400.

Referring to FIG. 6B, in a monitoring apparatus 1000a according to some embodiments, the measuring circuit 300 may be arranged with the charging circuit ("Cha. Cir.") 100 in a power loss protection (PLP) IC 1500 that is also referred to as the PLP block/system 1500. The measuring circuit 300 may include the measurer 310 and the determiner 330.

In the case that the measuring circuit 300 is arranged in the PLP IC 1500, the PLP IC 1500 may further include an event generating circuit ("Event Gen. Cir.") 500. In more detail, in the case that the measuring circuit 300 is arranged in the PLP IC 1500 and monitors a state of the secondary power device 200, the measuring circuit 300 may (e.g., may have to) obtain information about the state of the secondary power device 200 and may send the information to the control circuit 400 arranged in a main system IC 2000a. Accordingly, the event generating circuit 500 may be arranged in the PLP IC 1500. The event generating circuit 500 may send, as an event signal such as an interrupt, the information about the state of the secondary power device 200 to the control circuit 400 of the main system IC 2000a. For example, the event generating circuit 500 may periodically send a high signal to the control circuit 400, and when a defect occurs in the secondary power device 200, the event generating circuit 500 may send a low signal to the control circuit 400, thereby sending the information about the state of the secondary power device 200 to the control circuit 400.

As described above with reference to FIG. 5D, in the case that various defective states of the secondary power device 200 are distinguished therebetween, the event generating circuit 500 may generate various signals corresponding to the various defective states and may send the various signals to the control circuit 400, thereby sending information about a detailed defective state of the secondary power device 200 to the control circuit 400.

Referring to FIG. 6B, the secondary power device 200 and the PLP IC 1500 are separately arranged, but in practice, the secondary power device 200 may be arranged in the PLP IC 1500 and thus may be a part included in the PLP IC 1500. However, in some embodiments, the secondary power device 200 and the PLP IC 1500 may be separately arranged.

Figure 7:
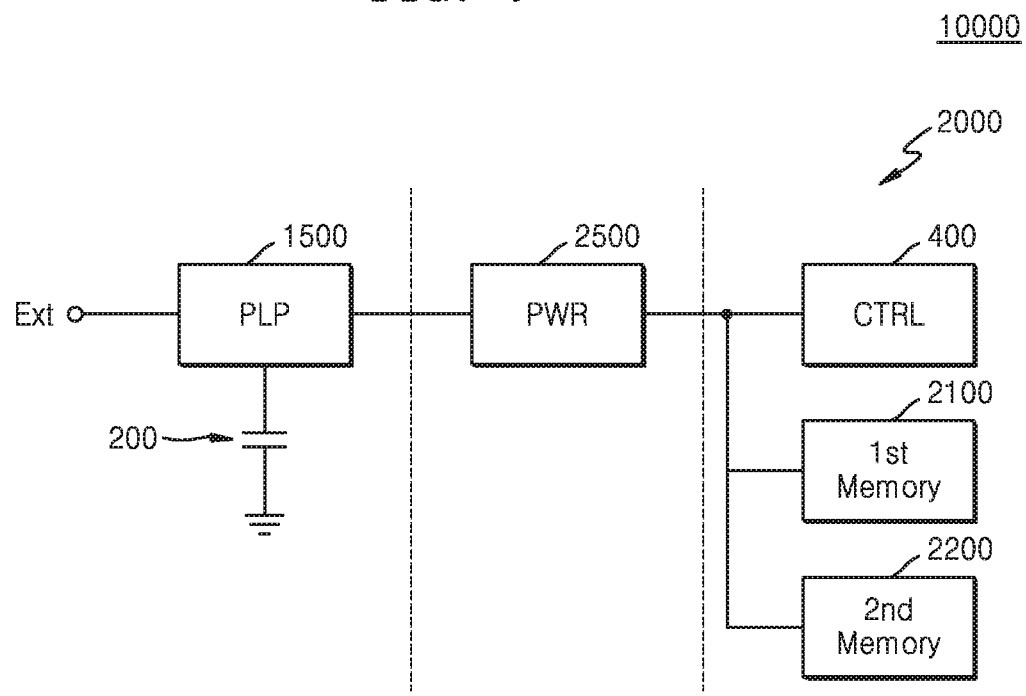
FIG. 7 is a block diagram illustrating a structure of a memory system including a monitoring apparatus, according to some embodiments.

FIG. 7 is a block diagram illustrating a structure of a memory system 10000 including a monitoring apparatus, according to some embodiments. Descriptions that are provided above with reference to FIGS. 1 through 6B may be briefly provided again or omitted.

Referring to FIG. 7, the memory system 10000 according to some embodiments may include a PLP block 1500, a power block ("PWR") 2500, and a main system block 2000.

The PLP block 1500 may be configured to inhibit/prevent a loss of power that is supplied to the main system block 2000. For example, the PLP block 1500 may internally include the charging circuit 100 and the secondary power device 200. Referring to FIG. 7, the secondary power device 200 and the PLP block 1500 are separately arranged, but this arrangement may be provided for convenience in describing an operation of the PLP block 1500 with reference to FIGS. 8A and 8B. As described above, the secondary power device 200 may be arranged in the PLP block 1500 and thus may be regarded as a part included in the PLP block 1500. However, in some embodiments, the secondary power device 200 and the PLP block 1500 may be separately arranged.

The measuring circuit 300 and the event generating circuit 500 may be arranged in the PLP block 1500, as illustrated in FIG. 6B. In the case that the measuring circuit 300 and the event generating circuit 500 are arranged in the PLP block 1500, the measuring circuit 300 may not be arranged in the main system block 2000.

The power block 2500 may be configured to supply power received via the PLP block 1500 to the main system block 2000. For example, the power block 2500 may correspond to power input and output terminals of the main system block 2000.

The main system block 2000 may include the control circuit 400, a first memory chip 2100, and a second memory chip 2200. One of the first memory chip 2100 and the second memory chip 2200 may be a cache memory, and the other one may be a main memory. In some embodiments, a chip corresponding to the main memory may have a multilayer structure. According to a type of the main memory, the memory system 10000 may correspond to one of an SSD module, dynamic random-access memory (DRAM) module, and a flash module. In the SSD module, DRAM may be used as the cache memory and a NAND flash memory may be used as the main memory.

In the memory system 10000 according to some embodiments, the main system block 2000 may use relatively high energy as backup energy. For example, the main system block 2000 may use energy of at least 10 megajoules (mJ) as backup energy that is supplied from the secondary power device 200. In more detail, the memory system 10000 may be the SSD module in which the main system block 2000 uses energy of at least 10 mJ as backup energy. However, a type of the memory system 10000 is not limited to the SSD module.

The control circuit 400 may control a data read operation, a data write operation, a data erase operation, etc. of the main system block 2000. In addition, the control circuit 400 may receive information about a state of the secondary power device 200, thereby controlling the charging circuit 100 of the PLP block 1500.

As illustrated in FIG. 6A, the measuring circuit 300 may be arranged in the main system block 2000. In the case that the measuring circuit 300 is arranged in the main system block 2000, the control circuit 400 may receive the information about the state of the secondary power device 200 directly from the measuring circuit 300. In the case that the measuring circuit 300 is arranged in the main system block 2000, both the measuring circuit 300 and the event generating circuit 500 may not be arranged in the PLP block 1500.

Figure 8A:
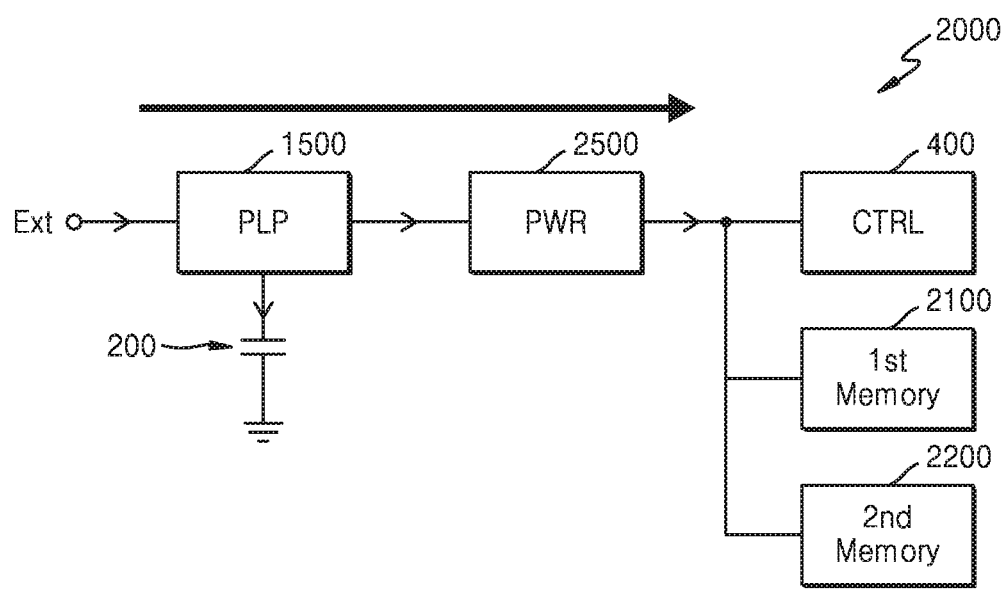
FIGS. 8A and 8B are diagrams illustrating a power supply process in the memory system of FIG. 7.
Figure 8B:
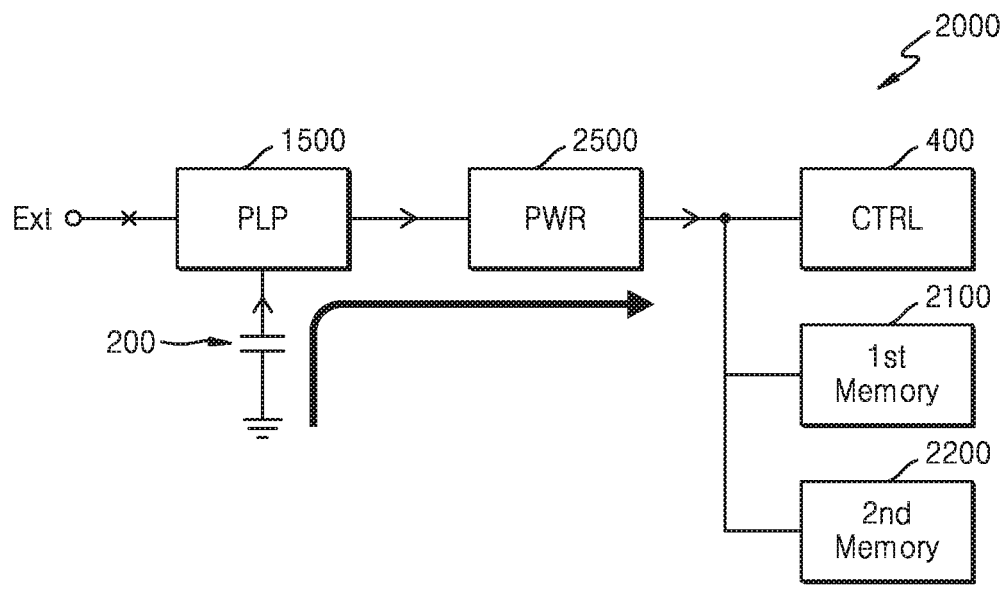

FIGS. 8A and 8B are diagrams illustrating a power supply process in the memory system 10000 of FIG. 7.

Referring to FIGS. 8A and 8B, in the case that there is no error in an external (e.g., main/primary) power source Ext, power from the external power source Ext may be supplied to the main system block 2000 via the PLP block 1500 and the power block 2500 as shown using a bold arrow in FIG. 8A. In addition, the power from the external power source Ext may be supplied to the charging circuit 100 in the PLP block 1500, such that a charging operation of the charging circuit 100 may be periodically and repeatedly performed on the secondary power device 200.

In the case that an SPO situation occurs due to an error in the external power source Ext, power may be supplied from the secondary power device 200 to the main system block 2000 via the PLP block 1500 and the power block (e.g., a power circuit/system) 2500 as shown using a bold arrow in FIG. 8B. Accordingly, even in the SPO situation, the main system block 2000 may continuously perform an operation by using the power of the secondary power device 200, such that a data loss may be inhibited/prevented. However, when the secondary power device 200 has a defect, the main system block 2000 may not be able to use the power of the secondary power device 200 in the occurrence of the SPO situation, such that a data loss may be unavoidable.

The memory system 10000 according to some embodiments may internally include the monitoring apparatus 1000 (refer to FIG. 6A) or the monitoring apparatus 1000a (refer to FIG. 6B). Accordingly, the secondary power device 200 may be monitored in real time. Thus, a user may repair or replace the secondary power device 200 in response to an occurrence of a defect in the secondary power device 200. As a result, the memory system 10000 according to some embodiments may inhibit/prevent in advance a problem of a data loss that may occur when an operation of the main system block 2000 is discontinued due to the defect in the secondary power device 200 in the SPO situation.

Figure 9:
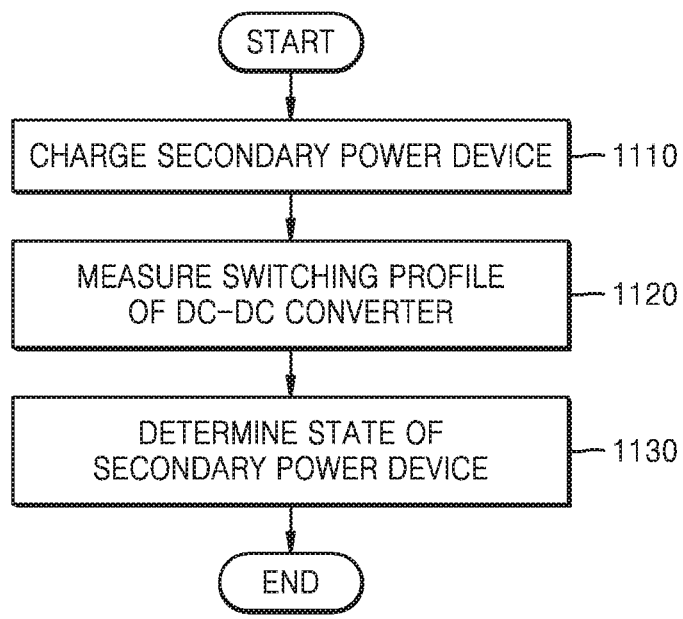
FIG. 9 is a flowchart of a method of monitoring the secondary power device, according to some embodiments.

FIG. 9 is a flowchart of a method of monitoring the secondary power device 200, according to some embodiments. Descriptions that are provided above with reference to FIGS. 1 through 8B may be briefly provided again or omitted. For convenience of understanding, descriptions may be provided with reference to FIGS. 1 through 4B.

Referring to FIG. 9, the secondary power device 200 is charged via the charging circuit 100 (Block 1110). The secondary power device 200 may include at least two capacitors 210 that are connected in one of series, series and parallel, or parallel. The charging circuit 100 may include the DC-DC converter 100a or 100b. In this regard, charging may indicate that the capacitors 210 in the secondary power device 200 are charged. In addition, charging may indicate that the secondary power device 200 is periodically and repeatedly charged.

Next, a switching profile of the DC-DC converter 100a or 100b is measured by using the measurer 310 of the measuring circuit 300 (Block 1120). The switching profile of the DC-DC converter 100a or 100b may include an ON-OFF profile of an FET (refer to the FET 110a FIG. 2B), and a power profile of the secondary power device 200. The power profile of the secondary power device 200 may correspond to an output voltage profile of the DC-DC converter 100a or 100b. For example, voltages of the capacitors 210 are detected by using the voltage detector 312 of the measurer 310, and a time of an ON-period and/or an OFF-period of the FET may be measured by using the timer 314 or the tick counter 314a. The voltage detection and time measurement with respect to the ON-period and/or the OFF-period of the FET will be described in detail in descriptions with reference to FIG. 10.

Afterward, a state of the secondary power device 200 is determined based on the measured switching profile of the DC-DC converter 100a or 100b (Block 1130). For example, the measured time/duration of the ON-period and/or the OFF-period of the FET is compared with a reference time, and in the case that a difference between the measured time and the reference time is within a set/predetermined range, the state of the secondary power device 200 is determined as a normal state. On the other hand, in the case that the difference between the measured time and the reference time is out of the set/predetermined range, the state of the secondary power device 200 is determined as an abnormal state. Moreover, a method of monitoring (and/or managing/ controlling) the secondary power device 200 may include completing a read, write, or erase operation of a memory system 10000, after the determining (Block 1130) that the state of the secondary power device 200 is abnormal, and while the secondary power device 200 is supplying power to the memory system 10000. Accordingly, because it has not been forcibly discharged, the secondary power device 200, despite being in the abnormal state, may complete the read, write, or erase operation before the secondary power device 200 is repaired or replaced. The determination on the state of the secondary power device 200 will be described in detail in descriptions with reference to FIG. 10.

Figure 10:
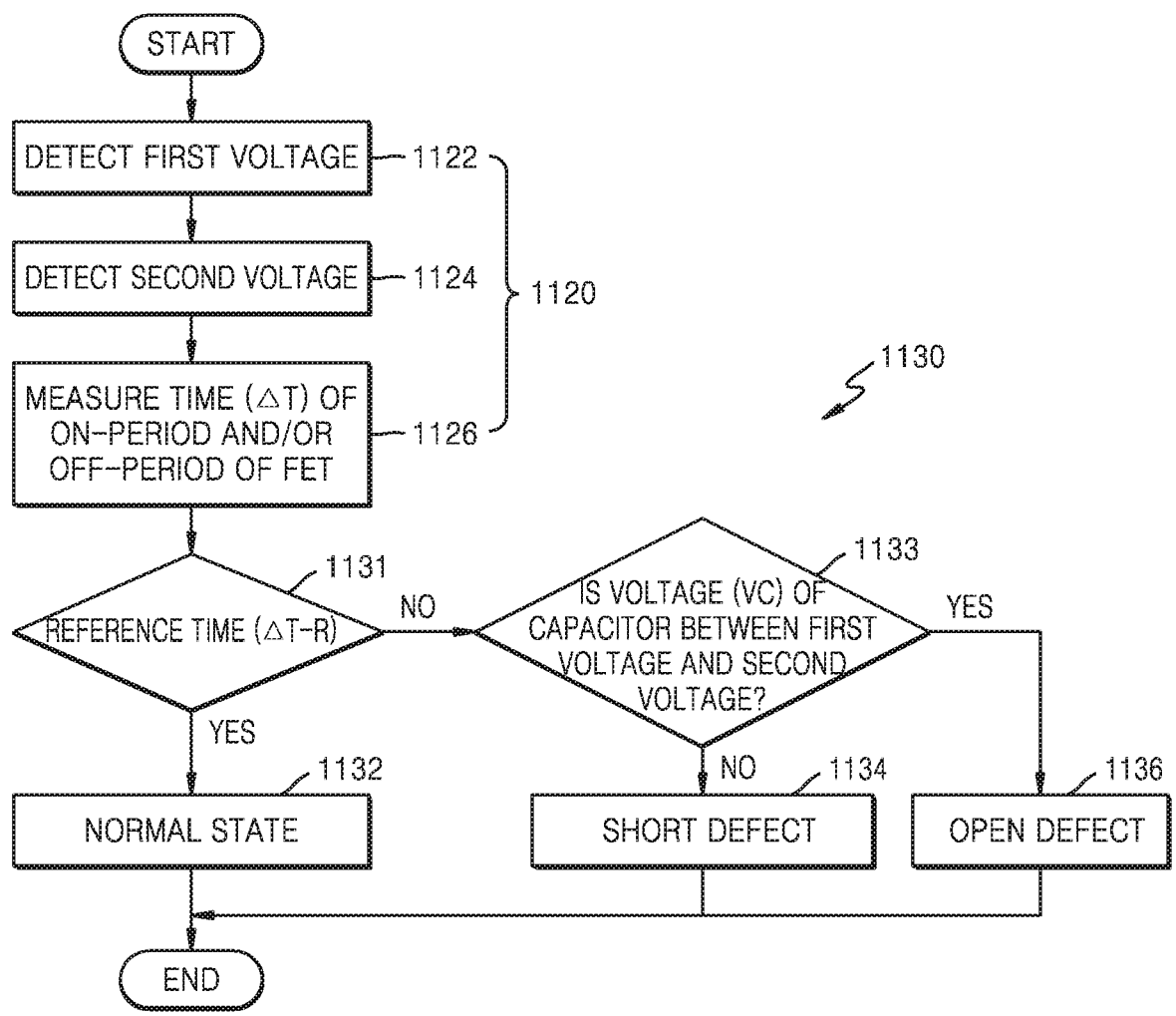
FIGS. 10 and 11 are flowcharts of the measuring of a switching profile and the determining of a state of a secondary power device in the method of FIG. 9 in detail.
Figure 11:
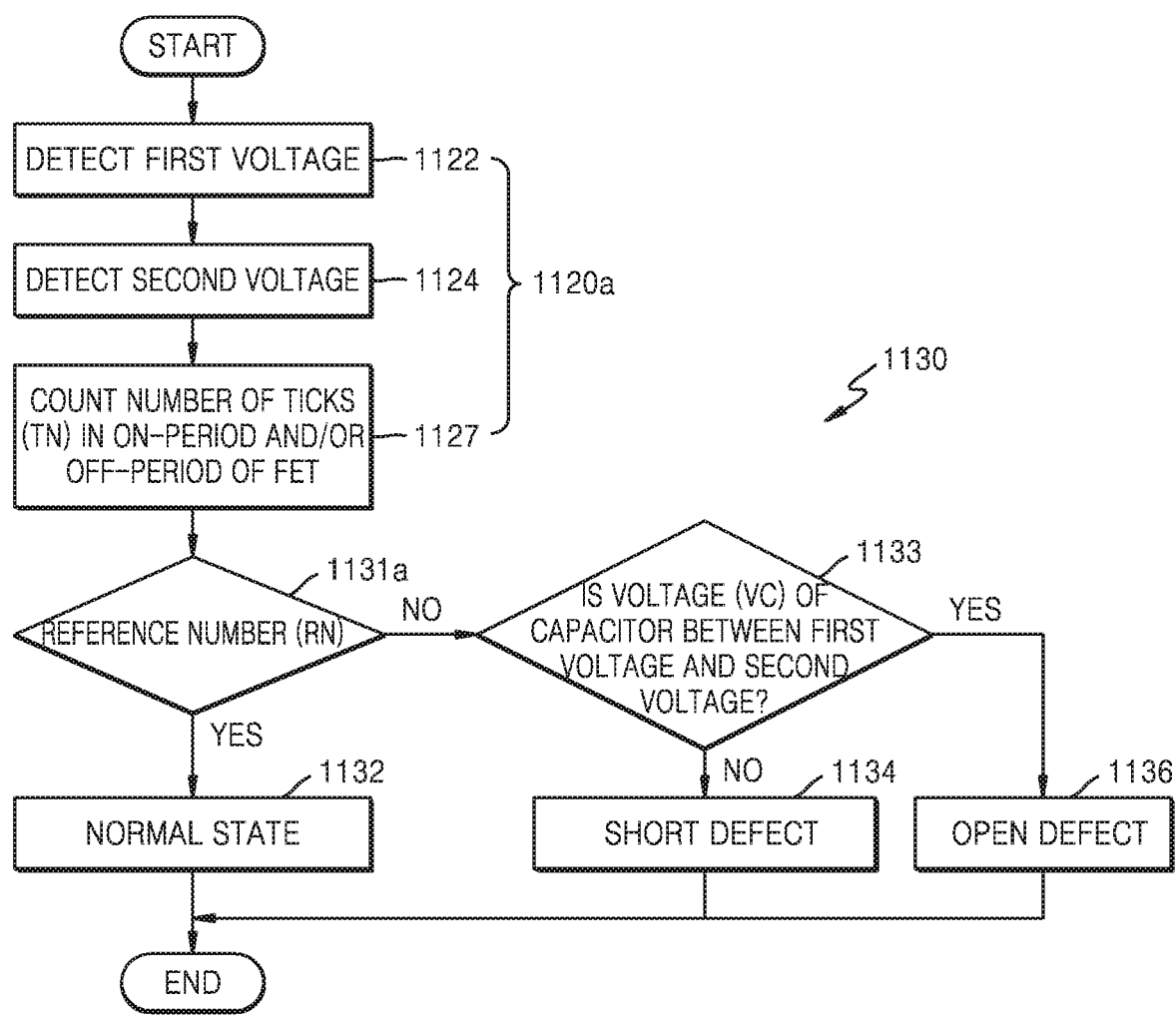

FIGS. 10 and 11 are flowcharts providing details of the measuring of a switching profile (Block 1120) and the determining of the state of a secondary power device (Block 1130) in the method of FIG. 9.

Referring to FIG. 10, a first voltage (refer to the first voltage B of FIG. 5A) of the capacitor 210 is detected by using the voltage detector 312 of the measurer 310 (Block 1122). In addition, a second voltage (refer to the second voltage A of FIG. 5A) of the capacitor 210 is detected by using the voltage detector 312 (Block 1124). Referring to FIG. 10, the first voltage B is first detected and then the second voltage A is detected, but an order of detection is not limited thereto. Thus, the second voltage A may be first detected and then the first voltage B may be detected. Alternatively, the first voltage B and the second voltage A may be almost/substantially simultaneously detected.

Afterward, a time $\Delta T$ of the ON-period and/or the OFF-period of the FET is measured by using the timer 314 of the measurer 310 or the tick counter 314$a$ of the measurer 310$a$ (Block 1126). The ON-period of the FET may correspond to a charging period of the capacitor 210 in which a voltage of the capacitor 210 rises from the first voltage B to the second voltage A. The OFF-period of the FET may correspond to a discharging period of the capacitor 210 in which a voltage of the capacitor 210 falls from the second voltage A to the first voltage B.

The detecting of the first voltage (Block 1122), the detecting of the second voltage (Block 1124), and the measuring of the time $\Delta T$ of the ON-period and/or the OFF-period of the FET (Block 1126) may be included among operations of Block 1120 of measuring the switching profile of the DC-DC converter 100$a$ or 100$b$.

Afterward, it is determined whether the time $\Delta T$ of the ON-period and/or the OFF-period of the FET is equal to a reference time $\Delta T$-R within a set/predetermined range (Block 1131). In this regard, a symbol '≈' may denote the sameness within the set/predetermined range. For example, in the case that the set/predetermined range is ±5%, and a difference between the time $\Delta T$ of the ON-period and/or the OFF-period of the FET and the reference time $\Delta T$-R is within ±5%, it may be determined that the time $\Delta T$ and the reference time $\Delta T$-R are equal to each other. On the other hand, in the case that the difference exceeds ±5%, it may be determined that the time $\Delta T$ and the reference time $\Delta T$-R are not equal to each other. Moreover, the set/predetermined range is not limited to ±5%. For example, when a precise determination is desirable/required, the set/predetermined range may be set to be less than ±5%.

The time $\Delta T$ of the ON-period and/or the OFF-period of the FET may include a time $\Delta T$on of the ON-period of the FET and a time $\Delta T$off of the OFF-period of the FET. In addition, the reference time $\Delta T$-R may include a reference time $\Delta T$on-R (refer to FIG. 5A) with respect to the ON-period of the FET and a reference time $\Delta T$off-R (refer to FIG. 5A) with respect to the OFF-period of the FET. Thus, the time $\Delta T$on of the ON-period of the FET may be compared with the reference time $\Delta T$on-R with respect to the ON-period of the FET, and the time $\Delta T$off of the OFF-period of the FET may be compared with the reference time $\Delta T$off-R with respect to the OFF-period of the FET. In this regard, the determination of the normal state may be performed based on one of the two comparisons or may be performed based on both of the two comparisons.

When (e.g., responsive to determining that) the time $\Delta T$ of the ON-period and/or the OFF-period of the FET is equal to the reference time $\Delta T$-R within the set/predetermined range (in the case of YES), the state of the secondary power device 200 is determined to be a normal state (Block 1132).

When the time $\Delta T$ of the ON-period and/or the OFF-period of the FET is not equal to the reference time $\Delta T$-R within the set/predetermined range (in the case of NO), that is, when a difference between the time $\Delta T$ of the ON-period and/or the OFF-period of the FET and the reference time $\Delta T$-R exceeds the set/predetermined range, it is determined whether a voltage Vc of the capacitor 210 is between the first voltage B and the second voltage A (Block 1133). The voltage Vc of the capacitor 210 may be detected by using the voltage detector 312 of the measurer 310.

When the voltage Vc of the capacitor 210 is between the first voltage B and the second voltage A (in the case of YES), it is determined that the state of the secondary power device 200 is an abnormal state and an open defect has occurred in some (one or more) of the capacitors 210 of the secondary power device 200 (Block 1136).

When the voltage Vc of the capacitor 210 is not between the first voltage B and the second voltage A (in the case of NO), for example, when the third voltage C (refer to FIG. 5D) that is lower than the first voltage B is detected in the voltage Vc of the capacitor 210, it is determined that the state of the secondary power device 200 is an abnormal state and a short defect has occurred in some (one or more) of the capacitors 210 of the secondary power device 200 (Block 1134).

The determining of whether the time $\Delta T$ of the ON-period and/or the OFF-period of the FET is equal to the reference time $\Delta T$-R within the set range (Block 1131), the operation(s) of Block 1132, the operation(s) of Block 1133, the operation(s) of Block 1134, and/or the determining of the open defect in the capacitors 210 (Block 1136) may be included in the determining of the state of the secondary power device 200 (Block 1130).

In some embodiments, the determining of whether the voltage Vc of the capacitor 210 is between the first voltage B and the second voltage A (Block 1133) may be omitted. In this case, when the time $\Delta T$ of the ON-period and/or the OFF-period of the FET is not equal to the reference time $\Delta T$-R within the set/predetermined range (in the case of NO), it may be simply determined that the state of the secondary power device 200 is abnormal. In some embodiments, in the case that the state of the secondary power device 200 is determined to be in the abnormal state, the method may further include substantially/maximally maintaining the state of the secondary power device 200 at a normal state by adjusting the charging circuit 100, and/or notifying a user of the abnormal state for repairing or replacing the secondary power device 200.

Referring to FIG. 11, the method of monitoring the secondary power device 200 may be different from the method of monitoring the secondary power device 200 in FIG. 10, in that a time of the ON-period and/or the OFF-period of the FET is measured by using the tick counter 314a of the measurer 310a.

In more detail, after the detecting of the first voltage (Block 1122) and the detecting of the second voltage (Block 1124) are performed, the number of ticks Tn in the ON-period and/or the OFF-period of the FET is counted by using the tick counter 314a of the measurer 310a (Block 1127). The number of ticks Tn in the ON-period and/or the OFF-period of the FET may include the number of ticks Tn_on in the ON-period of the FET and the number of ticks Tn_off in the OFF-period of the FET.

Afterward, it is determined whether the number of ticks Tn is equal to a reference number Rn in a set/predetermined range (Block 1131a). For example, in the case that the set/predetermined range is ±5% and the reference number Rn is 50, when a counted number of ticks Tn is 51, the counted number may be determined to be equal to the reference number Rn, and when the counted number of ticks Tn is 55, the counted number may not be determined to be equal to the reference number Rn. The reference number Rn may include a reference number Rn_on with respect to the ON-period of the FET and a reference number Rn_off with respect to the OFF-period of the FET. Thus, the number of ticks Tn_on in the ON-period of the FET may be compared with the reference number Rn_on with respect to the ON-period of the FET, and the number of ticks Tn_off in the OFF-period of the FET may be compared with the reference number Rn_off with respect to the OFF-period of the FET. In this regard, the determination of a normal state may be performed based on one of the two comparisons or may be performed based on both of the two comparisons.

Processes thereafter may be the same as the descriptions provided above with reference to the method of monitoring the secondary power device 200 in FIG. 10.

Although the inventive concepts have been particularly shown and described with reference to example embodiments thereof, it will be understood that various changes in form and details may be made therein without departing from the scope of the following claims. Therefore, the scope of the inventive concepts is defined not by the detailed description of the inventive concepts but by the appended claims and their equivalents, and shall not be restricted or limited by the foregoing detailed description.

What is claimed is:

1. A power management apparatus comprising:
a secondary power device comprising at least one capacitor;
a charging circuit comprising a direct current (DC)-DC converter and configured to supply power to the secondary power device; and
a measuring circuit configured to measure a switching profile of the DC-DC converter, and to determine a state of the secondary power device by comparing at least one time period of the switching profile with a reference time,
wherein the power management apparatus is in a memory system comprising at least one memory chip, and
wherein the power management apparatus is configured to monitor the state of the secondary power device in real time without a forced discharge of the at least one capacitor or without changing an operation mode of the memory system.

2. The power management apparatus of claim 1, wherein:
the DC-DC converter comprises a field effect transistor (FET) and an inductor,
the switching profile comprises an ON-period and an OFF-period of the FET, and
the measuring circuit is configured to determine the state of the secondary power device by comparing a duration of one of the ON-period or the OFF-period with the reference time.

3. The power management apparatus of claim 2,
wherein the measuring circuit is further configured to:
determine that the state of the secondary power device is normal, in response to a voltage of the at least one capacitor periodically and repeatedly rising and falling between a first voltage and a second voltage that is higher than the first voltage, and
determine that the state of the secondary power device is abnormal, in response to the voltage of the at least one capacitor exceeding a range between the first voltage and the second voltage or irregularly rising and falling, and
wherein the secondary power device is configured to supply power the memory system to complete a read, write, or erase operation of the memory system, after the measuring circuit determines that the state of the secondary power device is abnormal.

4. The power management apparatus of claim 3,
wherein the measuring circuit is further configured to determine that a short defect has occurred in the secondary power device, in response to the voltage of the at least one capacitor being lower than a third voltage that is lower than the first voltage, and
wherein the charging circuit is configured to discontinue charging of the secondary power device, in response to the measuring circuit determining that the short defect has occurred.

5. The power management apparatus of claim 3,
wherein the measuring circuit is further configured to determine that an open defect has occurred in the secondary power device, in response to the voltage of the at least one capacitor staying between the first voltage and the second voltage and a difference between the reference time and the duration of the one of the ON-period or the OFF-period exceeding a predetermined range, and
wherein the charging circuit is configured to adjust the ON-period and/or the OFF-period, or an input voltage of the FET, in response to the measuring circuit determining that the open defect has occurred.

6. The power management apparatus of claim 1, wherein:
the at least one capacitor of the secondary power device comprises a plurality of capacitors that are connected in one of series, series and parallel, or parallel, and
each of the plurality of capacitors comprises a tantalum capacitor, an aluminum capacitor, or a multi-layer ceramic condenser.

7. The power management apparatus of claim 1, wherein the measuring circuit comprises a voltage detector configured to measure a voltage of the at least one capacitor, and a timer or a tick counter configured to measure a duration of each time period of the switching profile.

8. The power management apparatus of claim 1, further comprising a control circuit configured to control the charging circuit,
wherein the measuring circuit and the control circuit are both in a main system that is a power supply target of the secondary power device, or the measuring circuit and the charging circuit are both in a power loss protection (PLP) system.

9. The power management apparatus of claim 8, wherein:
the PLP system comprises the measuring circuit and the charging circuit,
the main system comprises the control circuit,
the PLP system further comprises an event generating circuit, and
the event generating circuit is configured to send, as an event signal, information about the state of the secondary power device to the control circuit of the main system.

10. A power management apparatus comprising:
a secondary power device comprising a plurality of capacitors that are connected in parallel;
a direct current (DC)-DC converter comprising a field effect transistor (FET) as a switching device and configured to supply power to the secondary power device;
a measuring circuit configured to measure a switching profile of the DC-DC converter, and to determine a state of the secondary power device by comparing at least one time period of the switching profile with a reference time; and
a control circuit configured to control the DC-DC converter,
wherein the power management apparatus is in a memory system comprising at least one memory chip, and
wherein the power management apparatus is configured to monitor the state of the secondary power device in real time without a forced discharge of at least one of the plurality of capacitors or without changing an operation mode of the memory system.

11. The power management apparatus of claim 10, wherein:
the switching profile comprises an ON-OFF profile of the FET and an aggregate voltage profile of the plurality of capacitors,
the measuring circuit comprises a voltage detector configured to measure an aggregate voltage of the plurality of capacitors, and a timer or a tick counter configured to measure a duration of an ON-period and/or an OFF-period of the FET, and
the measuring circuit is further configured to determine the state of the secondary power device by comparing the duration of the ON-period and/or the OFF-period of the FET with the reference time.

12. The power management apparatus of claim 11, wherein the measuring circuit is further configured to:
determine that the state of the secondary power device is normal, in response to the aggregate voltage profile periodically and repeatedly rising and falling between a first voltage and a second voltage that is higher than the first voltage, and
determine that the state of the secondary power device is abnormal, in response to the aggregate voltage profile exceeding a range between the first voltage and the second voltage or irregularly rising and falling.

13. The power management apparatus of claim 10, wherein:
the measuring circuit and the control circuit are in a main system that is a power supply target of the secondary power device, or the measuring circuit and the DC-DC converter are in a power loss protection (PLP) system that comprises an event generating circuit, and
the event generating circuit is configured to send, as an event signal, information about the state of the secondary power device to the control circuit of the main system.

14. A memory system comprising:
a power loss protection (PLP) system comprising a secondary power device comprising a plurality of capacitors that are connected in parallel, and a direct current (DC)-DC converter configured to supply power to the secondary power device;
a main system comprising a control circuit and at least one memory chip; and
a power circuit between the PLP system and the main system, and configured to supply power to the main system,
wherein one of the PLP system or the main system further comprises a measuring circuit configured to monitor the secondary power device, based on a switching profile of the DC-DC converter, and
wherein the measuring circuit is further configured to monitor a state of the secondary power device in real time without a forced discharge of at least one of the plurality of capacitors or without changing an operation mode of the memory system.

15. The memory system of claim 14, wherein:
the DC-DC converter comprises a field effect transistor (FET) and an inductor, and
the measuring circuit is further configured to measure the switching profile, and to determine the state of the secondary power device by comparing at least one time period of the switching profile with a reference time.

16. The memory system of claim 15, wherein:
the switching profile comprises an ON-period and an OFF-period of the FET,
the measuring circuit comprises a voltage detector configured to measure an aggregate voltage of the plurality of capacitors, and a timer or a tick counter configured to measure a duration of the ON-period and a duration of the OFF-period of the switching profile, and
the measuring circuit is further configured to determine the state of the secondary power device by comparing the duration of one of the ON-period or the OFF-period with the reference time.

17. The memory system of claim 15, wherein:
the PLP system further comprises the measuring circuit and an event generating circuit, and
the event generating circuit is configured to send, as an event signal, information about the state of the secondary power device to the control circuit of the main system.

18. The memory system of claim 14,
wherein the memory system comprises one of a solid state drive (SSD), a dynamic random-access memory (DRAM), or a flash memory, and
wherein the one of the SSD, the DRAM, or the flash memory is configured to use a backup energy of at least 10 megajoules (mJ) from the secondary power device.

* * * * *